USO11257700B2

(12) United States Patent
Chung et al.

(10) Patent No.: US 11,257,700 B2
(45) Date of Patent: Feb. 22, 2022

(54) SEPARATORS FOR HANDLING, TRANSPORTING, OR STORING SEMICONDUCTOR WAFERS

(71) Applicant: Daewon Semiconductor Packaging Industrial Company, Santa Clara, CA (US)

(72) Inventors: Sunna Chung, Seoul (KR); Ryan Park, Santa Clara, CA (US); Jin Chae, Santa Clara, CA (US); Matthew Whitlock, Santa Clara, CA (US); Jonathan Lie, Santa Clara, CA (US); Athens Okoren, Hanam (KR)

(73) Assignee: Daewon Semiconductor Packaging Industrial Company, Santa Clara, CA (US)

( * ) Notice: Subject to any disclaimer, the term of this patent is extended or adjusted under 35 U.S.C. 154(b) by 0 days.

(21) Appl. No.: 16/116,847

(22) Filed: Aug. 29, 2018

(65) Prior Publication Data
US 2019/0067064 A1 Feb. 28, 2019

Related U.S. Application Data

(60) Provisional application No. 62/551,766, filed on Aug. 29, 2017.

(51) Int. Cl.
B65D 85/48 (2006.01)
H01L 21/673 (2006.01)

(52) U.S. Cl.
CPC .. *H01L 21/67383* (2013.01); *H01L 21/67346* (2013.01); *H01L 21/67366* (2013.01); *H01L 21/67373* (2013.01); H01L 21/67326 (2013.01)

(58) Field of Classification Search
CPC ......... H01L 21/67383; H01L 21/67346; H01L 21/67386; H01L 21/67373;
(Continued)

(56) References Cited

U.S. PATENT DOCUMENTS 5,418,692 A * 5/1995 Nemoto ............ H01L 21/67333
174/559
7,784,178 B2 * 8/2010 Davison .............. B29C 45/0001
29/848
(Continued)

Primary Examiner — Luan K Bui
(74) Attorney, Agent, or Firm — Perkins Coie LLP; Brian Coleman; Andrew T. Pettit

(57) ABSTRACT

Introduced here is a wafer separator configured to carry a semiconductor wafer with improved efficiency, protection, and reduced costs when utilized in the handling, transport, or storage of semiconductor components. The wafer separator may include a circular ring having an outer edge defining a periphery of the circular ring. The circular ring may include an inner edge defining a central opening of the circular ring. The wafer separator may include a first-right angled recess for receiving a semiconductor wafer that extends downward from a top surface of the circular ring. The wafer separator may also include a second right-angled recess for maintaining a gap beneath the semiconductor wafer when the semiconductor wafer is set within the first right-angled recess. In some embodiments, the wafer separator also includes interlock components for connecting the wafer separator to adjacent wafer separators.

19 Claims, 6 Drawing Sheets

(58) Field of Classification Search
CPC ............ H01L 21/67326; H01L 21/673; H01L 21/67369; H01L 21/67366; B65D 85/48
USPC ....... 206/454, 455, 499, 509, 511, 710, 711; 211/41.12, 41.14, 41.18
See application file for complete search history.

(56) References Cited

U.S. PATENT DOCUMENTS

| | | | |
|---|---|---|---|
| 8,844,719 B2* | 9/2014 | Yoshida | B65D 81/056 206/453 |
| 2004/0149623 A1* | 8/2004 | Amador | H01L 21/67396 206/710 |
| 2005/0072121 A1* | 4/2005 | Hortzleza | H01L 21/67346 53/447 |
| 2005/0098473 A1 | 5/2005 | Shehan, Jr. | |
| 2009/0095650 A1 | 4/2009 | Pylant et al. | |
| 2009/0196714 A1* | 8/2009 | Sylvestre | H01L 21/67778 414/217.1 |
| 2011/0042266 A1* | 2/2011 | Kasama | H01L 21/67369 206/710 |
| 2014/0076774 A1* | 3/2014 | Kaashoek | H01L 21/67379 206/711 |
| 2016/0365265 A1 | 12/2016 | Kirkland et al. | |
| 2017/0178937 A1* | 6/2017 | Escusa | H01L 21/67346 |
| 2017/0330778 A1* | 11/2017 | Nishijima | H01L 21/67369 |
| 2019/0013226 A1* | 1/2019 | Nishijima | H01L 21/67369 |

\* cited by examiner

SEPARATORS FOR HANDLING, TRANSPORTING, OR STORING SEMICONDUCTOR WAFERS

CROSS-REFERENCE TO RELATED APPLICATIONS

This application claims priority to U.S. Provisional Application No. 62/551,766, titled "Separators for Handling, Transporting, or Storing Semiconductor Wafers" and filed on Aug. 29, 2017, which is incorporated by reference herein in its entirety.

RELATED FIELD

The present technology generally relates to separators for protecting semiconductor components and, more specifically, to separators designed to protect semiconductor wafers while maintaining minimal contact with the semiconductor wafers.

BACKGROUND

Different configurations can be used to facilitate the handling, transport, and storage of semiconductor components, such as semiconductor wafers, semiconductor dies, etc. For example, manufacturers must often transport semiconductor components to various facilities to complete a semiconductor wafer manufacturing process and to manufacture integrated circuits from the semiconductor wafers.

One configuration to facilitate the handling, transport, and storage of semiconductor components may be utilizing an injection-molded tray. Injection-molded trays are used to restrict the movement of semiconductor components during transport to various testing and manufacturing facilities. The injection-molded trays may be designed specifically to contain and protect, for example, semiconductor wafers, which are generally thin and circular. Conventional injection-molded trays restrict the movement of the semiconductor components during transport by maintaining physical contact with the semiconductor components.

However, conventional injection-molded trays exhibit several limitations on providing adequate protection to sensitive semiconductor components. For example, conventional injection-molded trays may inadvertently damage a semiconductor component due to an external force that is applied to part(s) of the injection-molded tray in contact with the semiconductor component. The injection-molded trays may also fail to properly dissipate static electricity, which may lead to damage to the semiconductor component due to electrostatic discharge (ESD). Such limitations may lead to damaged semiconductor components, greater transport costs, and low efficiency of semiconductor wafer manufacturing and testing.

BRIEF DESCRIPTION OF THE DRAWINGS

Various features of the technology will become more apparent to those skilled in the art from a study of the Detailed Description in conjunction with the drawings. Embodiments of the technology are illustrated by way of example and not limitation in the drawings, in which like references may indicate similar elements.

Figure 1:
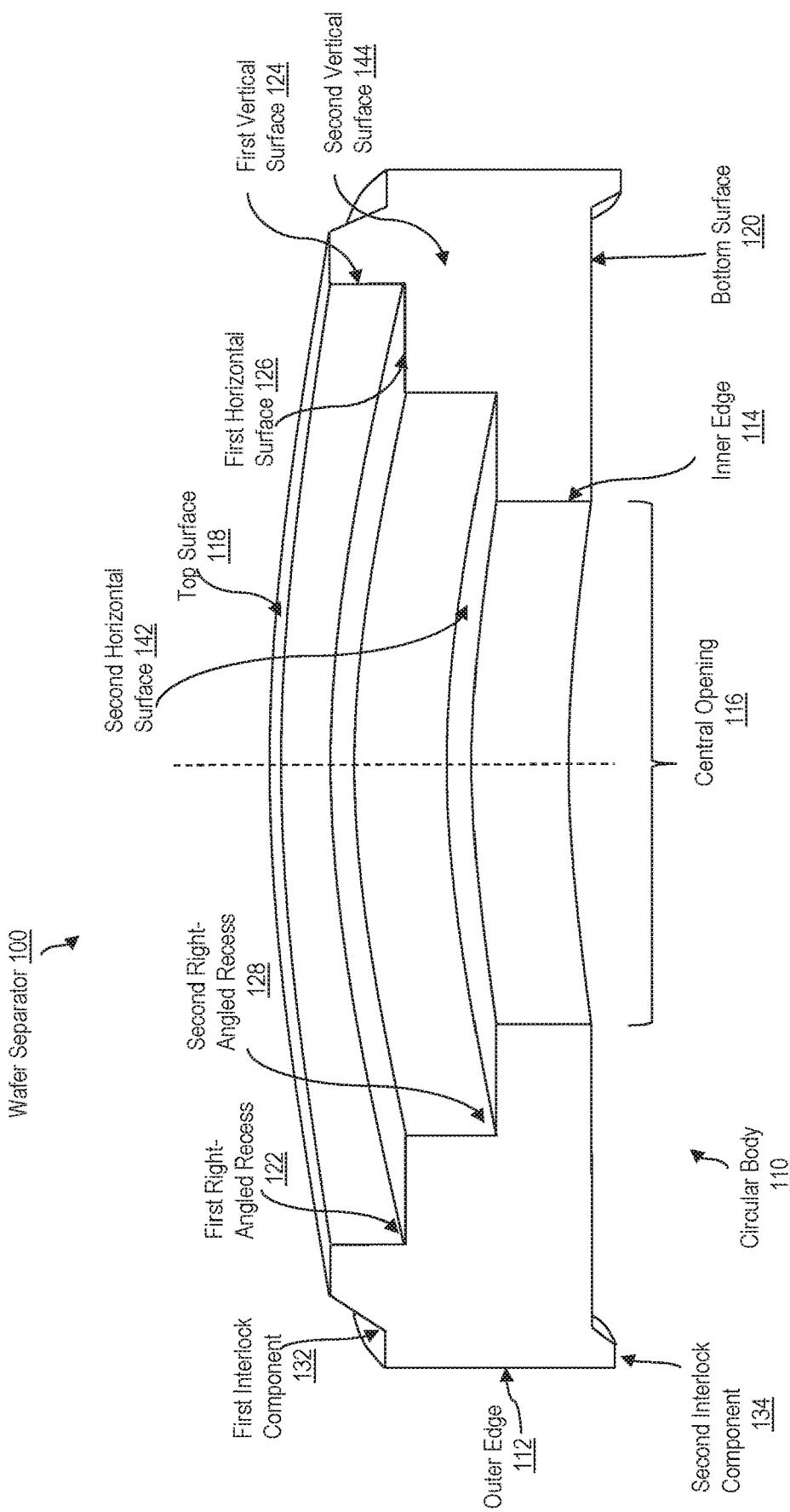
FIG. 1 is a cross-sectional, perspective view of a semiconductor wafer separator (also referred to more simply as "wafer separators" or "separators") designed to hold a semiconductor wafer.

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

Semiconductor component separators may carry semiconductor components and protect the semiconductor components from physical damage. Examples of semiconductors components include semiconductor wafers, semiconductor dies (e.g., bumped die or bare die), and other electronic components used in the fabrication of integrated circuits (ICs). Certain embodiments have been described in the context of semiconductor wafers for the purpose of illustration only. Those skilled in the art will recognize the separators introduced here could be used in the handling, transport, and/or storage of any type of semiconductor component.

Semiconductor wafer separators may be utilized to transport semiconductor wafers between multiple facilities during the semiconductor manufacturing and testing processes. Moreover, semiconductor wafer separators may be utilized to store semiconductor wafers within a storage facility before, during, or after such processes. Semiconductor wafer separators prevent semiconductor wafers from coming into contact with one another, thereby preventing damage to the semiconductor wafers. Semiconductor wafer separators may be used to present the semiconductor wafer to a manual placement tool or an automatic placement tool (also referred to as a "pick-and-place machine") for testing, wafer dicing, etc. Wafer dicing may dice the semiconductor wafer, and utilize a portion of the semiconductor wafer in the fabrication of an integrated circuit.

Semiconductor wafer separators can be used in the semiconductor industry in the transport of semiconductor wafers because semiconductor wafer separators reliably protect the semiconductor wafers from damage during transport. However, conventional semiconductor wafer separators suffer from several drawbacks. For example, many designs place the separator in direct contact with a large portion of the semiconductor wafer, which increases the risks of damage to the semiconductor wafer from physical contact and electrostatic discharge.

Introduced here, therefore, are semiconductor wafer separators that improve reliability in protecting the semiconductor wafers during handling, transport, and storage throughout various manufacturing and/or testing processes. The semiconductor wafer separator may include a first right-angled recess to receive a semiconductor wafer. The first right-angled recess is designed such that it has a specified width/depth that limits the portion of the semiconductor wafer in contact with the separator. The semiconductor wafer separator may also include a second right-angled recess to maintain a gap beneath the semiconductor wafer and prevent physical damage to the underside of the semiconductor wafer.

Terminology

References in this description to "an embodiment" or "one embodiment" means that the particular feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and comprising" are to be construed in an inclusive sense rather than an exclusive or exhaustive sense (i.e., in the sense of "including but not limited to"). The terms "connected," "coupled," or any variant thereof is intended to include any connection or coupling, either direct or indirect, between two or more elements. The coupling/connection can be physical, logical, or a combination thereof. For example, two devices may be physically, electrically, and/or communicatively coupled to one another.

When used in reference to a list of multiple items, the word "or" is intended to cover all of the following interpretations: any of the items in the list, all of the items in the list, and any combination of items in the list.

Technology Overview

FIG. 1 is a cross-sectional, perspective view of a semiconductor wafer separator 100 (also referred to more simply as "wafer separators" or "separators") designed to hold a semiconductor wafer. As further described below, the semiconductor wafer separator 100 may be configured to handle semiconductor wafers of different sizes (e.g., wafers having a variety of diameters from 25.4 mm (1 inch) to 300 mm (11.8 inches)) to accommodate different semiconductor fabrication plants (also referred to as "fabs"), processes, etc. The semiconductor wafer separator 100 may be configured to maintain minimal contact with the semiconductor wafer to prevent damage to the semiconductor wafer.

In some embodiments, the wafer separator 100 includes a circular body 110 whose shape is substantially similar to that of the semiconductor wafer. The shape and/or size of the circular body 110 may correspond to the conventional circular shape of many semiconductor wafers. In other embodiments, the wafer separator 100 includes a noncircular body (though the cavity within which the semiconductor wafer is set may still be circular). The size and/or shape of the structural body of the wafer separator 100 may be based on the design of the container within which the wafer separator 100 is to be placed. For example, circular bodies may be used in combination with a cylindrical container, while noncircular bodies may be used in combination with a non-cylindrical container (e.g., a cuboid or a triangular prism).

In some embodiments, the circular body 110 takes the form of an annulus having an outer edge 112 defining the periphery of the circular body 110 and an inner edge 114 defining a central opening 116 of the circular body. The outer edge 112 may extend along the entire outer periphery of the circular body 110 in an uninterrupted manner. The inner edge 114, meanwhile, may be substantially parallel to the outer edge 112. Accordingly, when the semiconductor wafer is set within the circular body 110, the inner edge 114 may be substantially perpendicular to the bottom surface of the semiconductor wafer and substantially parallel to the outer edge of the semiconductor wafer. In some embodiments the sidewalls forming the inner edge 114 are substantially orthogonal to the undersign of the circular body 110, while in other embodiments the sidewalls forming the inner edge are pitched (i.e., angled). The central opening 116 may be arranged such that it is centered at the center of the semiconductor wafer separator 100 and/or the center of the semiconductor wafer.

The circular body 110 may include a top surface 118 and a bottom surface 120. The top surface 118 and the bottom surface 120 may be substantially parallel to one another, as well as substantially perpendicular to the outer edge 112. The top surface 118 may define the uppermost point (i.e., the greatest height of any surface) of the circular body 110. In some embodiments the bottom surface 120 defines the lowermost point of the circular body 110, while in other embodiments one or more interlock components disposed along the bottom surface 120 define the lowermost point(s).

A first right-angled recess 122 formed in the circular body 110 may be adapted to receive the semiconductor wafer. The first right-angled recess 122 may extend downward from the top surface 118. In some embodiments, the first right-angled recess 122 forms an angle that measures substantially 90 degrees and complements the form of the semiconductor wafer. Accordingly, the first right-angled recess 122 may comprise a first vertical surface 124 and a first horizontal surface 126 that are orthogonal to one another. The first vertical surface 124 may be substantially parallel with the outer edge 112, while the first horizontal surface 126 may be substantially parallel with the top surface 118. A semiconductor wafer may be in contact with the first horizontal surface 126 and/or the first vertical surface 124 when the semiconductor wafer is placed in the first right-angled recess 122.

Those skilled in the art will recognize that the first right-angled recess 122 could also form some other angle (i.e., other than substantially 90 degrees). For example, the first right-angled recess 122 may instead include a first horizontal surface 24 and/or a first vertical surface 126 that is curved. Curving the first vertical surface 24 of the first right-angled recess 122 may allow for less surface area of the first vertical surface 124 to be in contact with a semiconductor component. Additionally or alternatively, the first vertical surface 124 may include a pocket or a slot that allows the outer portion of the semiconductor wafer to fit into the first right-angled recess 122 and prevents vertical movement of the semiconductor wafer.

Figure 3:
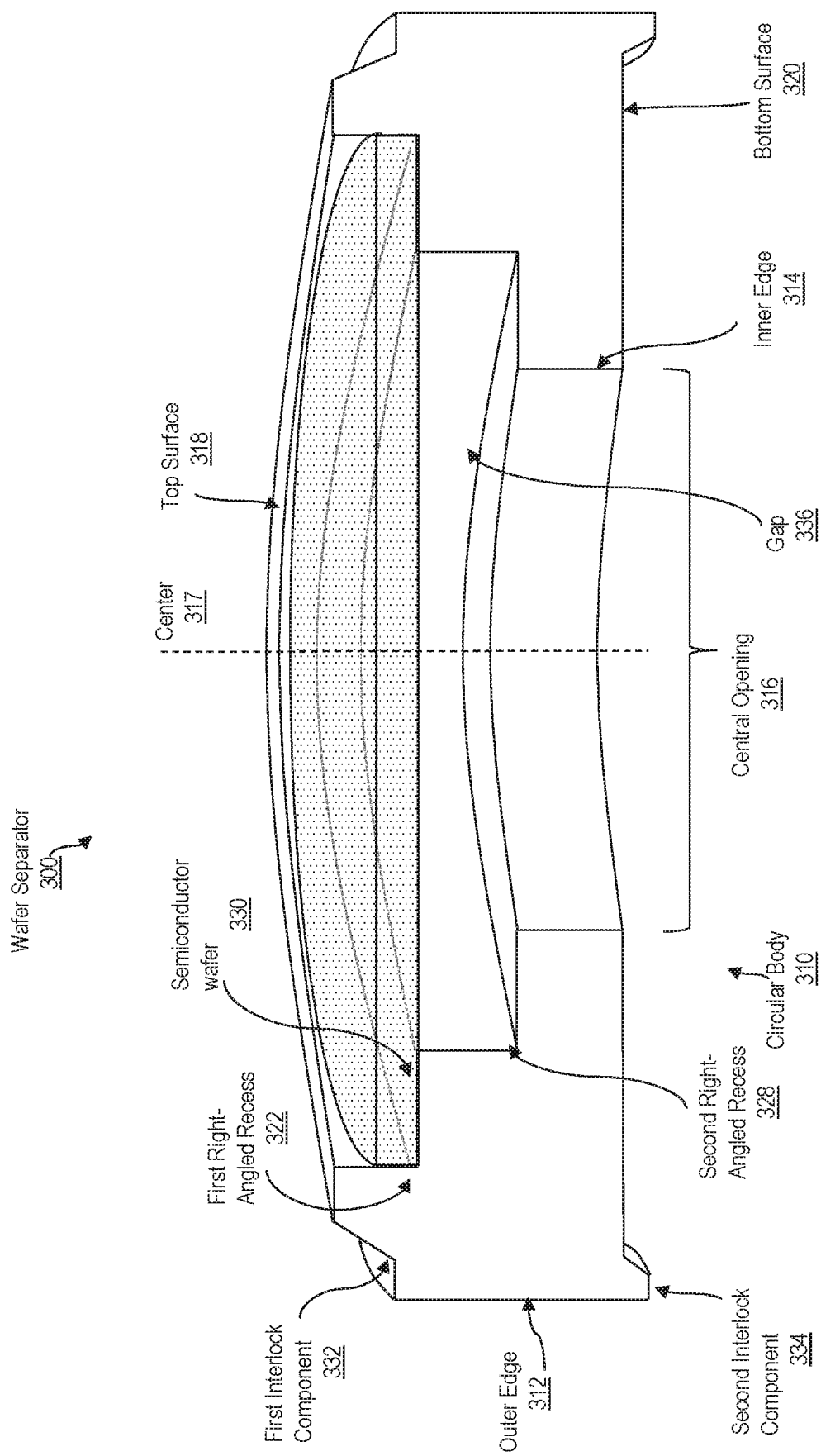
FIG. 3 is a cross-sectional view of the semiconductor wafer separator holding a semiconductor wafer.

The circular body 110 may also include a second right-angled recess 128 that extends downward from the first horizontal surface 126 of the first right-angled recess 122. However, the second right-angled recess 128 may not come into contact with the semiconductor wafer. As illustrated in FIG. 3, the second right-angled recess 128 may cause a gap to be formed beneath the semiconductor wafer. More specifically, a second vertical surface 144 may ensure that a gap of a specific height is formed between the semiconductor wafer and the second horizontal surface 142 of the second right-angled recess 128. The second right-angled recess 128 may include an angle substantially similar to that of the first right-angled recess 122.

A first interlock component 132 may be located on the circular body 110 of the semiconductor wafer separator 100. Here, for example, the first interlock component 132 is disposed along the top surface 118 of the circular body 110. The first interlock component 132 may be designed to engage with another interlock component.

A second interlock component 134 may also be located on the circular body 110 of the semiconductor wafer separator 100. Here, for example, the second interlock component 134 is disposed along the bottom surface 120 of the circular body 110.

The interlock components may be of various interlock types (e.g., complementary interlock types). For instance, one of the interlock components may comprise a first interlock component type, such as a notch, slot, recess, or another known form/component capable of receive an interlock component. Meanwhile, the other interlock component may comprise a second interlock component type, such as a protrusion, projection, or another known form/component capable of being received by an interlock component of the first interlock component type. The first component type and the second component type may be disposed at an angle relative to the outer edge 112.

The second interlock component 134 may comprise a different interlock component type than the first interlock component 132. Here, for example, the first interlock component 132 comprises a first interlock component type (e.g., a notch) and the second interlock component 134 comprises a second interlock component type (e.g., a protrusion). Accordingly, the first interlock component 132 can engage a corresponding interlock component of the second type on an upwardly-adjacent wafer separator, while the second interlock component 134 can engage a corresponding interlock component of the first type on a downwardly-adjacent wafer separator. The interlock components 132, 134 could be of the same interlock component type or different interlock component types.

While the interlock components of FIG. 1 extend around the entirety of the top and bottom surfaces 118, 120, those skilled in the art will recognize that other designs are also possible. More specifically, the top and bottom surfaces 118, 120 may each include a specified number (e.g., two, three, four, or eight) of interlock components. For example, the circular body 110 could include two interlock components on opposite sides of the top surface 118 and two interlock components on opposite sides of the bottom surface 120. As another example, the circular body 110 could include four interlock components equally distributed along the top surface 118 and four interlock components equally distributed along the bottom surface 120. The number of interlock components disposed along the top and bottom surfaces 118, 120 are generally the same to allow for easy stacking.

Figure 2:
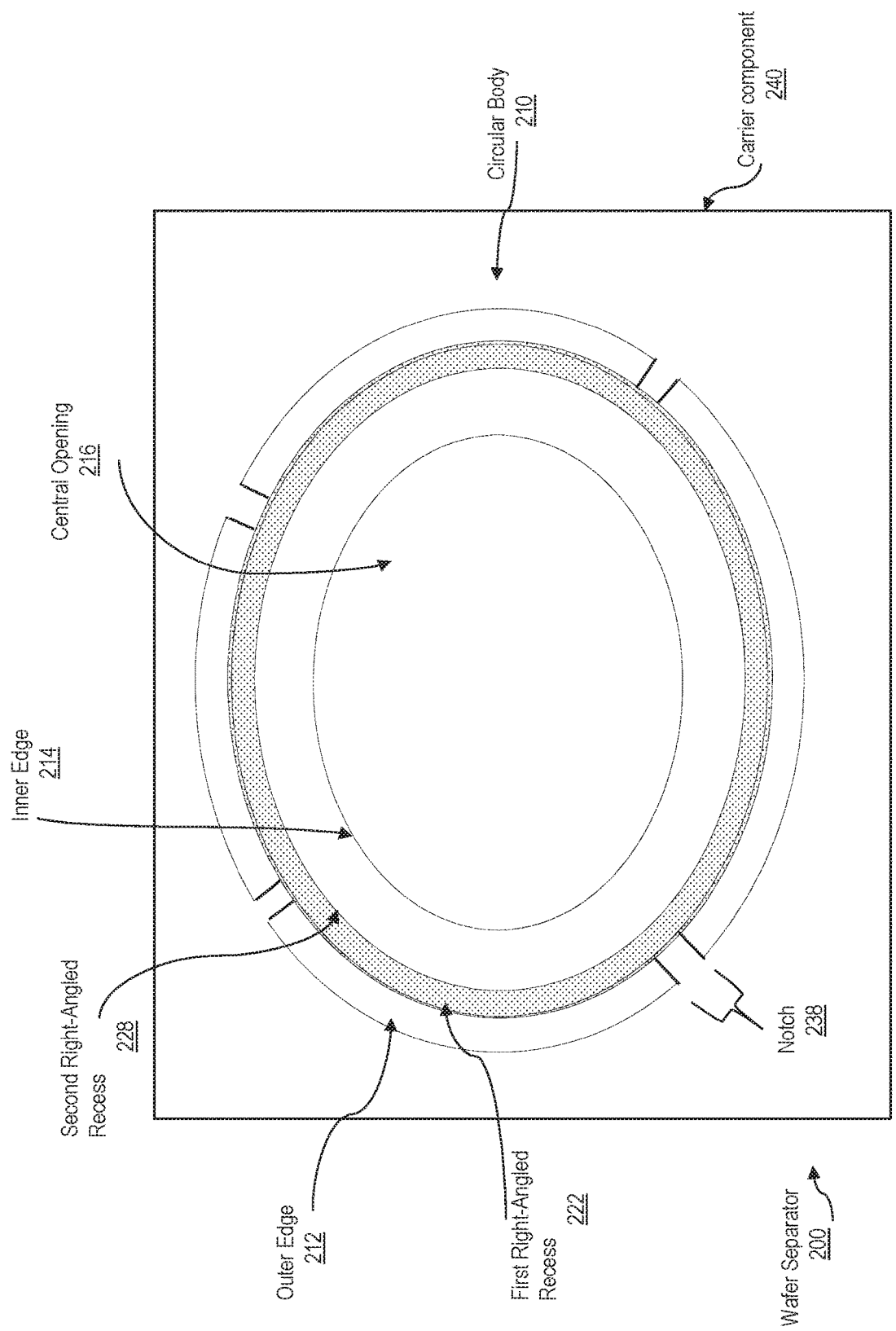
FIG. 2 is a top section view of the semiconductor wafer separator.

FIG. 2 is a top section view of the semiconductor wafer separator 200. The wafer separator 2 of FIG. 2 may be substantially similar to the wafer separator 100 of FIG. 1. As noted above, the first right-angled recess 222 and the second right-angled recess 228 may continuously extend along the periphery of the circular body 210. Alternatively, the first right-angled recess 222 may include a notch 238. The notch 238 represents an area (i.e., a break) where the first right-angled recess 222 does not extend along the periphery of the circular body 210. The notch 238 causes less of the first horizontal surface 226 of the first right-angled recess 222 to be in contact with the semiconductor wafer, while still allowing the first vertical surface 224 of the first right-angled recess 222 to prevent the semiconductor wafer from moving laterally.

The notch 238 may also allow for the semiconductor wafer to be removed from the circular body 210. More specifically, the notch 238 can partially or entirely extend through the circular body 210, thereby allowing the semiconductor wafer to be readily removed from the wafer separator 200 either manually or automatically (e.g., by a computer-implemented system, such as a pick-and-place robotic system). In some embodiments, the circular body 210 includes multiple notches 238. The notches 238 may be located equidistant around the periphery of the circular body 210.

The semiconductor wafer separator 200 may include a carrier component 240. The carrier component 240, which may comprise an outer portion of the circular body 210, can be configured to allow the wafer separator 200 to be easily transported. The carrier component 240 may be engaged to the outer edge 212 of the circular body 210. In some embodiments, the carrier component 240 is configured to allow for the wafer separator 200 and other wafer separators that are engaged to one another to be transported together with greater efficiency. The carrier component 240 may comprise a shape that may be easily transported, such as a substantially square, rectangular, or another known shape. In some embodiments the carrier component 240 is separately engaged to the circular body 210, while in other embodiments the wafer separator 200 is a single piece including the circular body 210 and the carrier component 240. The carrier component 240 may include handles, latches, or other known components to assist in the transport of the wafer separator 200.

FIG. 3 is a cross-sectional view of the semiconductor wafer separator 300 holding a semiconductor wafer 330. The wafer separator as described in FIG. 3 may be substantially similar to the wafer separator in FIG. 1 and FIG. 2. The semiconductor wafer 330 may be set in the first right-angled recess 322 of the circular body 310. The first right-angled recess 322 maintains contact with the semiconductor wafer 330 during handling, transport, storage, etc., and prevents the semiconductor wafer 330 from moving in various directions.

The height of the top surface 318 may be substantially similar to or equal to the height of the semiconductor wafer 330 when the semiconductor wafer 330 is set in the first right-angled recess 322. That is, the top surface 318 may be in line with the top surface of the semiconductor wafer 330. In some embodiments, the top surface 318 may be above than the top surface of the semiconductor wafer 330, which causes a space to be formed between the semiconductor wafer 330 and an upwardly-adjacent wafer separator.

The first right-angled recess 322 may prevent the semiconductor wafer 330 from coming into contact with another semiconductor wafer or some other external object. More specifically, the first right-angled recess 322 can come into contact with the outer portion of the semiconductor wafer 330, while allowing for the majority of the inner portion of the semiconductor wafer 330 to not be in contact with the circular body 310. Minimizing contact between the semiconductor wafer 330 and the circular body 310 may improve effectiveness in protecting the semiconductor from damage due to external forces and/or ESD. Accordingly, some embodiments of the semiconductor wafer separator 300 maximize the diameter of the central opening 316 by minimizing the depth/width of the first right-angled recess 322 and/or the second right-angled recess 328 (while still ensuring that the semiconductor wafer 330 can stably sit within the first right-angled recess 322).

The second right-angled recess 328 may be configured to maintain a gap 336 beneath the semiconductor wafer 330 when the semiconductor wafer 330 is set within the first right-angled recess 322. The second right-angled recess 328 may have a second vertical surface of a specified height that ensures the gap 336 is of the specified height. In some embodiments the second right-angled recess 328 creates the gap 336 between the bottom surface of the semiconductor wafer 330 and the second horizontal surface 342 of the second right-angled recess 328, while in other embodiments the second right-angled recess 328 created the gap between the bottom surface of the semiconductor wafer 330 and the top surface of a downwardly-adjacent semiconductor wafer. The gap 336 may assist in preventing damage to the inner portion of the semiconductor wafer 330. The inclusion of spaces and gaps, such as gap 336, provides an air gap between the semiconductor wafer 330 and the wafer separator 300. Air gaps may assist in preventing the collection of static electricity and damage from electrostatic discharge onto the semiconductor wafer 330. The air gaps may also assist in preventing damage to the semiconductor wafer 330.

Figure 4:
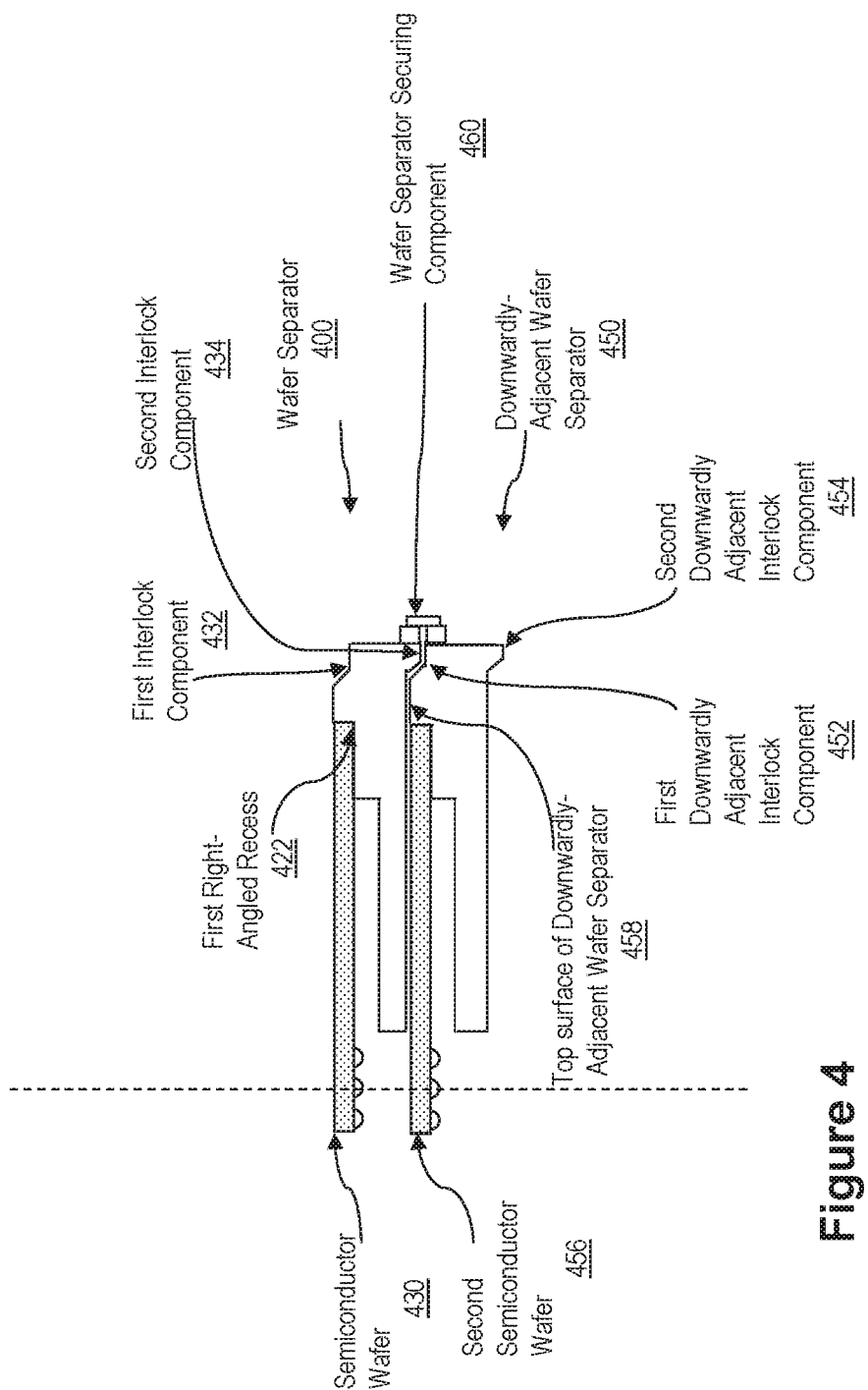
FIG. 4 is a cross-sectional view of multiple semiconductor wafer separators holding semiconductor wafers.

FIG. 4 is a cross-sectional view of multiple stacked semiconductor wafer separators holding semiconductor wafers. The wafer separators 400, 450 may be substantially similar to the wafer separator as described in FIG. 1, FIG. 2, and FIG. 3. Here, for example, the wafer separator 400 is engaged to a downwardly-adjacent wafer separator 450. Each wafer separator may be configured to engage with adjacent wafer separators, including downwardly-adjacent wafer separators and upwardly-adjacent wafer separators.

The wafer separator 400 may include a first interlock component 432 and a second interlock component 434. For example, the interlock components 432, 434 of the wafer separator 400 may be configured to engage with interlock components of an adjacent wafer separator. As shown in FIG. 4, the second interlock component 434 of the wafer separator 400 may engage a first interlock component 452 of the downwardly-adjacent wafer separator 450. The second interlock component 434 of the wafer separator 400 may comprise a protrusion, and the first interlock component 452 of the downwardly-adjacent wafer separator 450 may comprise a recess. Similarly, the first interlock component 432 of the wafer separator 400 may be a recess adapted to engage with a second interlock component of an upwardly-adjacent wafer separator (not shown).

The wafer separator 400 may receive a semiconductor wafer 430, and the downwardly-adjacent wafer separator 450 may receive a second semiconductor wafer 456. In some embodiments a space exists between the bottom surface 420 of the wafer separator 400 and the top surface of the second semiconductor wafer 456, while in order embodiments the bottom surface 420 of the wafer separator 400 is directly adjacent to the top surface of the second semiconductor wafer 456.

In some embodiments, a wafer separator securing component 460 is used to further secure and lock the wafer separator 400 to another wafer separator, such as the downwardly-adjacent wafer separator 450. The wafer separator securing component 460 may include a slot, latch, or other known locking component disposed on the outer edge 412 of the wafer separator 400. The wafer separator securing component 460 may be aligned and secured to a complementary securing component on the downwardly-adjacent wafer separator 450. Wafer separator securing components 460 could be used to secure the wafer separator 400 to any adjacent wafer separator (e.g., an upwardly-adjacent wafer separator and/or a downwardly-adjacent wafer separator).

The wafer separator securing component 460 may comprise multiple components configured to secure the wafer separators 400, 450 together using a known locking mechanism. For example, the wafer separator securing component 460 can include a locking component configured to lock the wafer separator 400 to the downwardly-adjacent wafer separator 450. Such a design reliably prevents independent movement of either wafer separator 400, 450 and prevents damage to the semiconductor wafers 430, 456 during transport.

Figure 5:
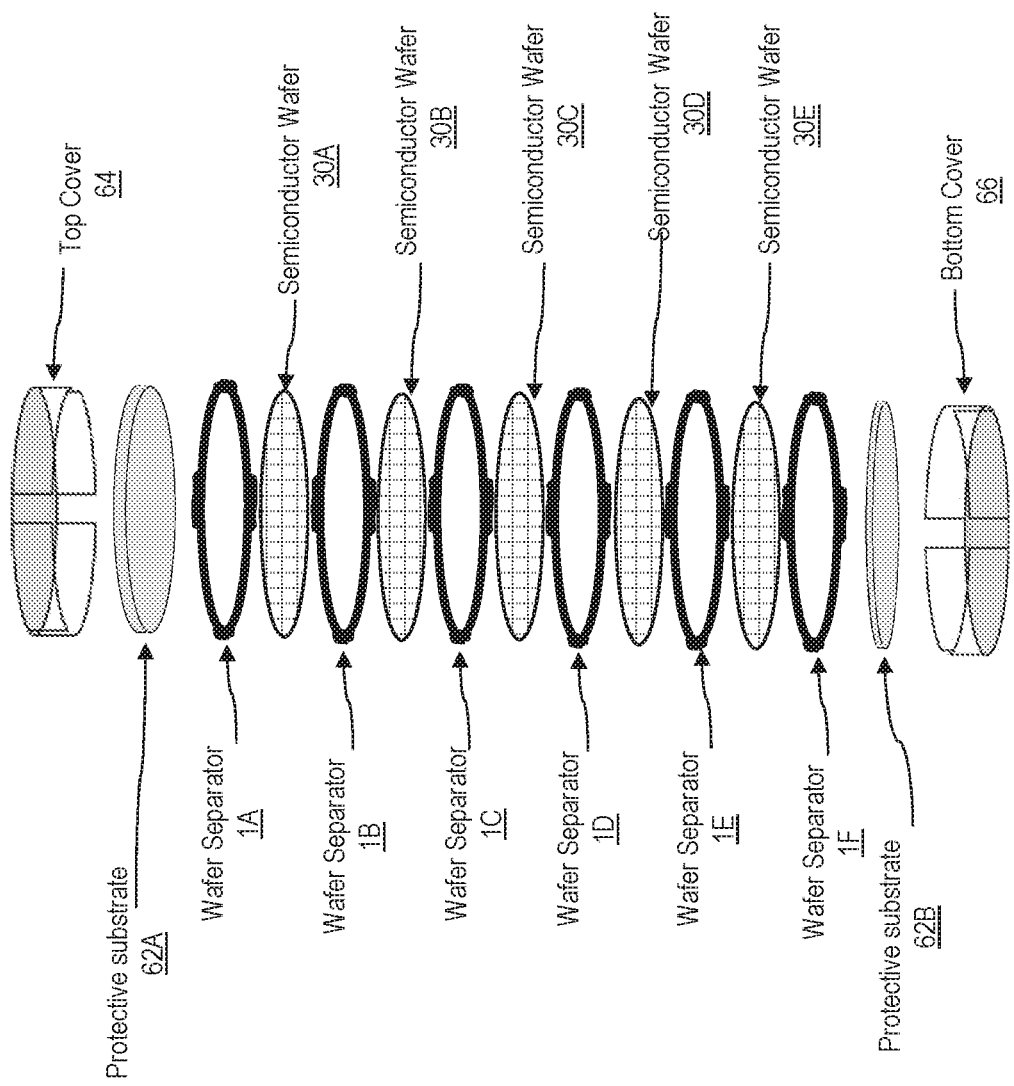
FIG. 5 is an exploded view of multiple semiconductor wafer separators and semiconductor wafers stacked for handling, transport, and/or storage of the multiple semiconductor wafers.

FIG. 5 is an exploded view of multiple semiconductor wafer separators 1A-F and semiconductor wafers 30A-E stacked for handling, transport, and/or storage of the multiple semiconductor wafers 30A-E.

As illustrated in FIG. 5, multiple wafer separators 1A-F may be used to separately retain multiple semiconductor wafers 30A-E. The multiple wafer separators 1A-F may be stacked together to allow for the simultaneous transport of multiple semiconductor wafers 30A-E. Transporting multiple semiconductor wafers 30A-E simultaneously may increase efficiency in transport and the manufacture of semiconductor wafers 30A-E and integrated circuits (ICs).

The circular body of each wafer separator may be configured to engage with an adjacent wafer separator. In some embodiments, the carrier component (e.g., carrier component 240 of FIG. 2) of each wafer separator may be stacked. The carrier components may allow for the wafer separators 1A-F to be stacked and transported with greater efficiency. The carrier components may be configured to fit in a conventional transport size.

To provide further protection of the semiconductor wafers 30 during transport, one or more protective substrates 62A, 62B may be utilized. The protective substrates 62A, 62B may comprise a lightweight, resilient material, such as polyethylene foam or polypropylene thermoplastic. Other known material could also be used to protect the fragile semiconductor wafers 30A-E. The protective substrate 62A, 62B may be resistive to moisture and/or electricity to prevent static electricity collection and electrostatic discharge. The protective substrate 62A, 62B may comprise an anti-static material that prevents the buildup of static electricity.

In some embodiments, a first protective substrate 62A is disposed between the top cover 64 and the uppermost wafer separator 1A-F and a second protective substrate 62B may be disposed between the bottom cover 66 and the lowermost wafer separator 1A-F. Moreover, one or more protective substrates 62A, 62B could be disposed between each pair of the wafer separators to provide additional protection from damage and electrostatic discharge. A protective substrate may be configured to be disposed within one or both of the covers 64, 66. The protective substrate 62A, 62B may engage a given wafer separator, for example, by engaging the interlock components of the given wafer separator.

A top cover 64 may be disposed above the wafer separators 1A-F. The top cover 64 may be an additional protective component to protect the semiconductor wafers 30 during transport. The top cover 64 may protect the wafer separators 1A-F and semiconductor wafers 30A-E from damage due to external forces applied from above (e.g., to the top cover 64). The top cover 64 may be configured to be placed over one or more wafer separators 1A-E stacked together. The top cover 64 may engage the uppermost wafer separator (or another of the wafer separators), for example, by engaging an interlock component of the uppermost wafer separator. Additionally or alternatively, the top cover 64 can engage the wafer separator securing component of the uppermost wafer separator (or another of the wafer separators).

A bottom cover 66 may be disposed below the wafer separators 1A-F. The bottom cover 66 may have substantially similar qualities as the top cover 64. The top cover 64 may engage the bottom cover 66, which may cover some or all of the wafer separators 1A-F and the semiconductor wafers 30A-E. The top cover 64 and bottom cover 66 may prevent moisture from contacting the semiconductor wafers 30A-E.

Any of the wafer separators 1A-F, top cover 64, and bottom cover 66 may comprise a known material suitable for injection molding. For example, the wafer separator 1A-F may be composed of an anti-static or static-dissipative material. As another example, the wafer separator 1A-F may be composed of a resilient material able to protect the semiconductor wafers 30A-E from physical damage. The material of any of the wafer separator 1A-F, top cover 64, and bottom cover 66 may comprise polypropylene thermoplastic, ethylene chlorotrifluoroethylene (ECTFE), or any other material used in the semiconductor industry to create injection-molded trays or wafer separators. In some embodiments, the wafer separators 1A-F comprise at least two materials, including a first resilient material to avoid physical damage and a second anti-static or non-conductive material. The second material may be sprayed onto the first material, adhered to the first material, or incorporated into the first material (e.g., during the manufacturing process).

Figure 6:
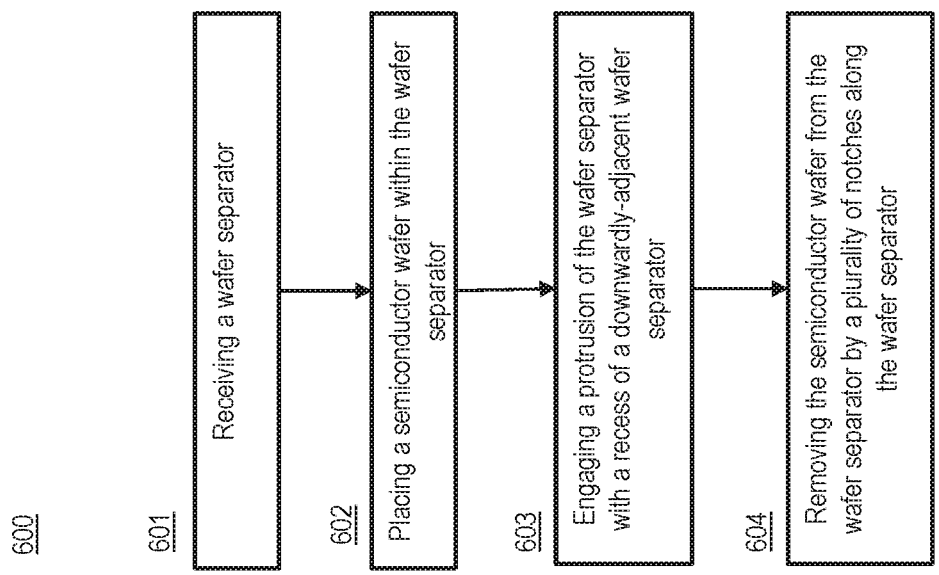
FIG. 6 depicts an example method of handling a semiconductor wafer using a semiconductor wafer separator.

Another object of the present technology introduced here is to provide techniques to safely carry, transport, and remove a semiconductor wafer from a semiconductor wafer separator. FIG. 6 depicts an example method 600 of handling a semiconductor wafer using a semiconductor wafer separator.

A manufacturer or some other entity involved in the semiconductor wafer manufacturing and transportation process may receive a wafer separator (step 601). The wafer separator can include a circular ring that includes an outer edge defining a periphery of the wafer separator. The circular ring may also include an inner edge defining a central opening. The wafer separator (e.g. the wafer separator 100 in FIG. 1) can include a first right-angled recess extending downward from a top surface of the circular ring and a second right-angled recess configured to maintain a gap beneath a semiconductor wafer set within the first right-angled recess.

The semiconductor wafer can then be placed within the wafer separator (step 602). As illustrated in FIG. 3, the semiconductor wafer may be placed within the first right-angled recess of the wafer separator. Placing the semiconductor wafer within the first right-angled recess of the wafer separator allows the wafer separator to restrict movement of the semiconductor wafer while maintaining minimal contact with the semiconductor wafer.

In some embodiments, a protrusion on the wafer separator engages a recess of an adjacent wafer separator (step 603). For example, the wafer separator may engage an upwardly-adjacent wafer separator and/or a downwardly-adjacent wafer separator. A protrusion on the outer surface of the wafer separator can engage a recess disposed along the outer surface of the adjacent wafer separator (e.g., a downwardly-adjacent wafer separator). Moreover, a recess disposed along the outer surface of the wafer separator can engage a protrusion disposed along the outer surface of another adjacent wafer separator (e.g., an upwardly-adjacent wafer separator). Thus, the wafer separator may include different types of interlock component. Each interlock component may be configured to engage with a corresponding interlock component on an adjacent wafer separator.

The semiconductor wafer may be removed from the wafer separator by a plurality of notches along the wafer separator (step 604). For example, a manual or automatic tool may be configured to pick up the semiconductor wafer from the wafer separator. The plurality of notches on the wafer separator may be utilized to safely and efficiently remove the semiconductor wafer from the wafer separator without damaging the semiconductor wafer or the wafer separator (which may be reused multiple times). The plurality of notches may be located equidistant around the periphery of the circular body of the wafer separator.

Unless contrary to physical possibility, it is envisioned that the steps described above may be performed in various sequences and combinations. Additional steps could also be included in some embodiments. For example, the manufacturer/packager (or some other entity) could vacuum seal the wafer separator(s) or perform some other technique for reducing the likelihood of damage from ESD.

Although some embodiments are described in the context of certain semiconductor components (e.g., semiconductor wafers or semiconductor dies), those skilled in the art will readily appreciate that the technology can be used to secure other electronic components as well.

Remarks

The foregoing examples of various embodiments have been provided for the purposes of illustration and description. These examples are not intended to be exhaustive. Many variations will be apparent to one skilled in the art. Certain embodiments were chosen in order to best describe the principles of the technology introduced herein, thereby enabling others skilled in the relevant art to understand the claimed subject matter, the various embodiments, and the variations that may be suited to particular uses.

The language used in the specification has been principally selected for readability and instructional purposes. It may not have been selected to delineate or circumscribe the subject matter. Therefore, it is intended that the scope of the technology be limited not by this specification, but rather by any claims that issue based hereon. Accordingly, the disclosure of the technology is intended to be illustrative (rather than limiting) of the scope of the technology, which is set forth in the following claims.

What is claimed is:

1. A semiconductor wafer separator comprising:
   a circular ring that includes—
     an outer edge defining a periphery of the circular ring, and
     an inner edge defining a central opening of the circular ring;
   a first right-angled recess configured to receive a semiconductor wafer;
   a second right-angled recess that is located adjacent the first right-angled recess such that a gap is maintained beneath the semiconductor wafer when the semiconductor wafer is set within the first right-angled recess;
   a first interlock component that extends downward from a top surface of the circular ring to form a shelf that is accessible along the outer edge of the circular ring;
   a second interlock component that extends downward from a bottom surface of the circular ring around the periphery; and
   a locking mechanism located along the outer edge of the circular ring that is configured to secure the semiconductor wafer separator to an adjacent wafer separator.

2. The semiconductor wafer separator of claim 1,
   wherein the first interlock component is representative of a recess adapted to engage a corresponding second interlock component of an upwardly-adjacent wafer separator,
   wherein the recess has an inwardly-pitched surface that complements an outwardly-pitched surface of the upwardly-adjacent wafer separator, and wherein the inwardly-pitched surface causes the recess to be narrowest along the shelf and widest along the top surface of the circular ring.

3. The semiconductor wafer separator of claim 1, wherein the second interlock component is representative of a protrusion adapted to engage a corresponding first interlock component of a downwardly-adjacent wafer separator,
wherein the protrusion has an outwardly-pitched surface that complements an inwardly-pitched surface of the downwardly-adjacent wafer separator, and
wherein the outwardly-pitched surface causes the protrusion to narrow as the distance from the bottom surface of the circular ring increases.

4. The semiconductor wafer separator of claim 1, wherein the top surface of the circular ring is substantially coplanar with a top surface of the semiconductor wafer when the semiconductor wafer is set within the first right-angled recess.

5. The semiconductor wafer separator of claim 1, wherein the first right-angled recess comprises a notch configured to facilitate the removal of the semiconductor wafer from the circular ring when the semiconductor wafer is set within the first right-angled recess.

6. The semiconductor wafer separator of claim 1, wherein the first right-angled recess comprises a plurality of notches disposed equidistant along the periphery of the circular ring, and wherein the plurality of notches are configured to facilitate the removal of the semiconductor wafer from the circular ring when the semiconductor wafer is set within the first right-angled recess.

7. The semiconductor wafer separator of claim 3, further comprising:
the semiconductor wafer set within the first right-angled recess of the semiconductor wafer separator;
the downwardly-adjacent wafer separator; and
a second semiconductor wafer set within the downwardly-adjacent wafer separator.

8. The semiconductor wafer separator of claim 7, wherein the bottom surface of the circular ring includes a feature that causes a space to be formed between the bottom surface of the circular ring and a top surface of the second semiconductor wafer set within the downwardly-adjacent wafer separator.

9. The semiconductor wafer separator of claim 1, further comprising a carrier component extending outward from the outer edge of the circular ring.

10. The semiconductor wafer separator of claim 1, wherein the semiconductor wafer separator comprises polypropylene thermoplastic.

11. A system comprising:
at least two wafer separators configured to transport at least two semiconductor wafers, each wafer separator of the at least two wafer separators including:
a circular ring composed of ethylene chlorotrifluoroethylene (ECTFE) that has—
an outer edge defining a periphery of the circular ring, and
an inner edge defining a central opening of the circular ring;
a first right-angled recess configured for receiving a semiconductor wafer;
a second right-angled recess disposed adjacent the first right-angled recess such that a gap is maintained beneath the semiconductor wafer when the semiconductor wafer is set within the first right-angled recess;
a first interlock component that extends downward from a top surface of the circular ring to form a shelf that is accessible along the outer edge of the circular ring, the first interlock component being configured to engage an upwardly-adjacent wafer separator;
a second interlock component that extends downward from a bottom surface of the circular ring, the second interlock component being configured to engage a downwardly-adjacent wafer separator; and
a securing component located along the outer edge of the circular ring that that is securable to a complementary securing component of the upwardly-adjacent wafer separator or the downwardly-adjacent wafer separator.

12. The system of claim 11, wherein each wafer separator further comprises:
a carrier component extending outward from the outer edge of the circular ring.

13. The system of claim 11, further comprising:
a first cover disposed above an uppermost wafer separator of the at least two wafer separators;
a second cover disposed below a lowermost wafer separator of the at least two wafer separators;
a first protective substrate disposed between the first cover and the uppermost wafer separator; and
a second protective substrate disposed between the second cover and the lowermost wafer separator.

14. The system of claim 11, wherein the first interlock component is one of a first plurality of interlock components arranged along the top surface of the circular ring, and wherein the second interlock component is one of a second plurality of interlock components arranged along the bottom surface of the circular ring.

15. A method comprising:
receiving a wafer separator that includes—
an annular structural body having:
an outer edge defining a periphery of the annular structural body, and
an inner edge defining a central opening of the annular structural body;
a first right-angled recess extending downward from a top surface of the annular structural body,
a second right-angled recess that is located adjacent the first right-angled recess, and
a securing component located along the outer edge of the annular structural body;
placing a semiconductor wafer within the first right-angled recess of the wafer separator such that a top surface of the semiconductor wafer is substantially coplanar with the top surface of the annular structural body,
wherein when the semiconductor wafer is placed within the first right-angled recess of the wafer separator, a gap is present beneath the semiconductor wafer due to the second right-angled recess; and
connecting the wafer separator to another wafer separator by securing the securing component to a complementary securing component of the other wafer separator.

16. The method of claim 15, wherein the other wafer separator is a downwardly-adjacent wafer separator, and wherein the method further comprises:
engaging a protrusion on a bottom surface of the wafer separator with a recess on a top surface of the downwardly-adjacent wafer separator to secure the wafer separator to the downwardly-adjacent wafer separator.

17. The method of claim 15, wherein the other wafer separator is an upwardly-adjacent wafer separator, and wherein the method further comprises:
  engaging a recess on a top surface of the wafer separator with a protrusion on a bottom surface of the upwardly-adjacent wafer separator to secure the wafer separator to the upwardly-adjacent wafer separator.

18. The method of claim 15, further comprising:
  removing the semiconductor wafer from the first right-angled recess of the wafer separator using at least one notch of a plurality of notches in the annular structural body.

19. The method of claim 18, wherein the plurality of notches are exposed on the outer edge and the inner edge, and wherein the plurality of notches are located equidistant around the periphery of the annular structural body.

* * * * *